United States Patent [19]
Xiang et al.

[11] Patent Number: 6,091,243
[45] Date of Patent: Jul. 18, 2000

[54] WATER-FAT IMAGING WITH DIRECT PHASE ENCODING (DPE)

[75] Inventors: Qing-San Xiang; Li An, both of Vancouver, Canada

[73] Assignee: The University of British Columbia, Vancouver, Canada

[21] Appl. No.: 09/191,828

[22] Filed: Nov. 13, 1998

Related U.S. Application Data

[60] Provisional application No. 60/065,394, Nov. 13, 1997.

[51] Int. Cl.$^7$ .................................................. G01V 3/00
[52] U.S. Cl. ........................................... 324/307; 324/309
[58] Field of Search ................................... 324/307, 309, 324/312, 300, 311, 318

[56] References Cited

U.S. PATENT DOCUMENTS

| | | |
|---|---|---|
| 5,134,372 | 7/1992 | Inoue . |
| 5,144,235 | 9/1992 | Glover et al. . |
| 5,162,737 | 11/1992 | Nozokido et al. ....................... 324/309 |
| 5,225,781 | 7/1993 | Glover et al. . |
| 5,321,359 | 6/1994 | Schneider ................................ 324/307 |

OTHER PUBLICATIONS

Anh, C.B., "A New Phase Correction Method in NMR Imaging Based on Autocorrelation and Histogram Analysis," *IEEE Transactions on Medical Imaging*, vol. MI–6, No. 1, Mar. 1987, pp. 32–36.

An, Li, et al., "Quadrature 2–Point Water–Fat Imaging," *Proceedings of the Fourth Annual Scientific Meeting of the Society of Magnetic Resonance*, New York, NY, Apr. 27–May 3, 1996.

Dixon, W.T., "Simple Proton Spectroscopic Imaging," *Radiology*, vol. 153, Oct. 1984, pp. 180–184.

Gao, J.H., et al., "Effects on Selective Excitation and Phase Uniformity of Orthogonal Field Gradient Components," *Proceedings of the Tenth Annual Scientific Meeting of the Society for Magnetic Resonance in Medicine*, 1991, p. 132.

Glover, G.H., "Multipoint Dixon Technique for Water and Fat Proton and Susceptibility Imaging," *JMRI*, vol. 1, No. 5, Sep./Oct. 1991, pp. 521–530.

Glover, G.H., et al., "Three–Point Dixon Technique for True Water/Fat Decomposition with $B_0$ Inhomogeneity Correction," *Magnetic Resonance in Medicine*, vol. 18, 1991, pp. 371–383.

Graham, S.J., et al., "Changes in Fibroglandular Volume and Water Content of Breast Tissue During the Menstrual Cycle Observed by MR Imaging at 1.5 T," *JMRI*, vol. 5, Nov./Dec. 1995, pp. 695–701.

Hardy, P.A., et al., "Separation of Fat and Water in Fast Spin–Echo MR Imaging with the Three–Point Dixon Technique," *JMRI*, vol. 5, Mar./Apr. 1995, pp. 181–185.

Judge, T.R., et al., "A Review of Phase Unwrapping Techniques in Fringe Analysis," *Optics and Lasers in Engineering*, vol. 21, 1994, pp. 199–239.

*Primary Examiner*—Louis Arana
*Attorney, Agent, or Firm*—Christensen O'Connor Johnson & Kindness pllc

[57] ABSTRACT

A method acquires three complex images, wherein their respective phase differences between water and fat components are $\alpha_0$, $\alpha_0+\alpha$, and $\alpha_0+2\alpha$, respectively. The method obtains from these three complex images two possible solution sets for water and fat images. For pixels with both water and fat components, one correct solution set is selected using a binary choice based on the relative Larmor frequencies of water and fat. If a pixel contains only one component, a known statistical bias is applied to identify the component and, thus, the pixel. To correct misidentified pixels, various filters may be applied to all the pixels. The water and fat solutions obtained from the three complex images are used to produce separate images of water and fat. Second pass solutions of water and fat with improved signal-to-noise ratio can be obtained by either averaging or a least square error method.

22 Claims, 9 Drawing Sheets

OTHER PUBLICATIONS

Lodes, C.C., et al., "Proton MR Chemical Shift Imaging Using Double and Triple Phase Contrast Acquisition Methods," *Journal of Computer Assisted Tomography,* vol. 13, Nov. 5, Sep./Oct. 1989, pp. 855–861.

Riek, J.K., et al., "Flow Compensation in MRI Using a Phase–Corrected Real Reconstruction," *MRM,* vol. 30, 1993, pp. 724–731.

Skinner, T.E., et al., "An Extended Two–Point Dixon Algorithm for Calculating Separate Water, Fat, and $B_0$ Images," *MRM,* vol. 37, 1997, pp. 628–630.

Szumowski, J., et al., "Double–Echo Three–Point–Dixon Method for Fat Suppression MRI," *MRM,* vol. 34, 1995, pp. 120–124.

Szumowski, J., et al., "Phase Unwrapping in the Three–Point Dixon Method for Fat Suppression MR Imaging," *Radiology,* vol. 192, Aug. 1994, pp. 555–561.

Towers, D.P., et al., "Automatic Interferogram Analysis Techniques Applied to Quasi–Heterodyne Holography and ESPI," *Optics and Lasers in Engineering,* vol. 14, 1991, pp. 239–281.

Williams, S.C.R., et al., "True Water and Fat MR Imaging with Use of Multiple–Echo Acquisition," *Radiology,* vol. 173, 1989, pp. 249–253.

Xiang, Q.–S., et al., Weighted Average and its Application in Ghost Artifact Reduction, *JMRI,* Mar./Apr. 1991, p. 222.

Xiang, Q.–S., et al., "General 3–Point Water–Fat Imaging with Optimized SNR," *Proceedings of the Fourth Annual Scientific Meeting of the Society of Magnetic Resonance,* New York, NY, Apr. 27–May 3, 1996, p. 1544.

Xiang, Q.–S., et al., "Water–Fat Imaging with Three–Point Direct Phase Encoding," *Proceedings of the Third Scientific Meeting of the Society of Magnetic Resonance,* Nice, France, Aug. 19–25, 1995, p. 658.

Yeung, H.N., et al., "Separation of True Fat and Water Images by Correcting Magnetic Field Inhomogeneity in Situ," *Radiology,* vol. 159, Jun. 1986, pp. 783–786.

Yeung, H.N., et al., "Single–Acquisition Chemical–Shift Imaging of a Binary System with Use of Stimulated Echoes," *Radiology,* vol. 167, May 1988, pp. 537I–540.

Zhu, G., et al., "A Robust Water and Fat Separation Method," *Proceedings of the Fourth Annual Scientific Meeting of the Society of Magentic Resonance,* New York, NY, Apr. 27–May 3, 1996, p. 1542.

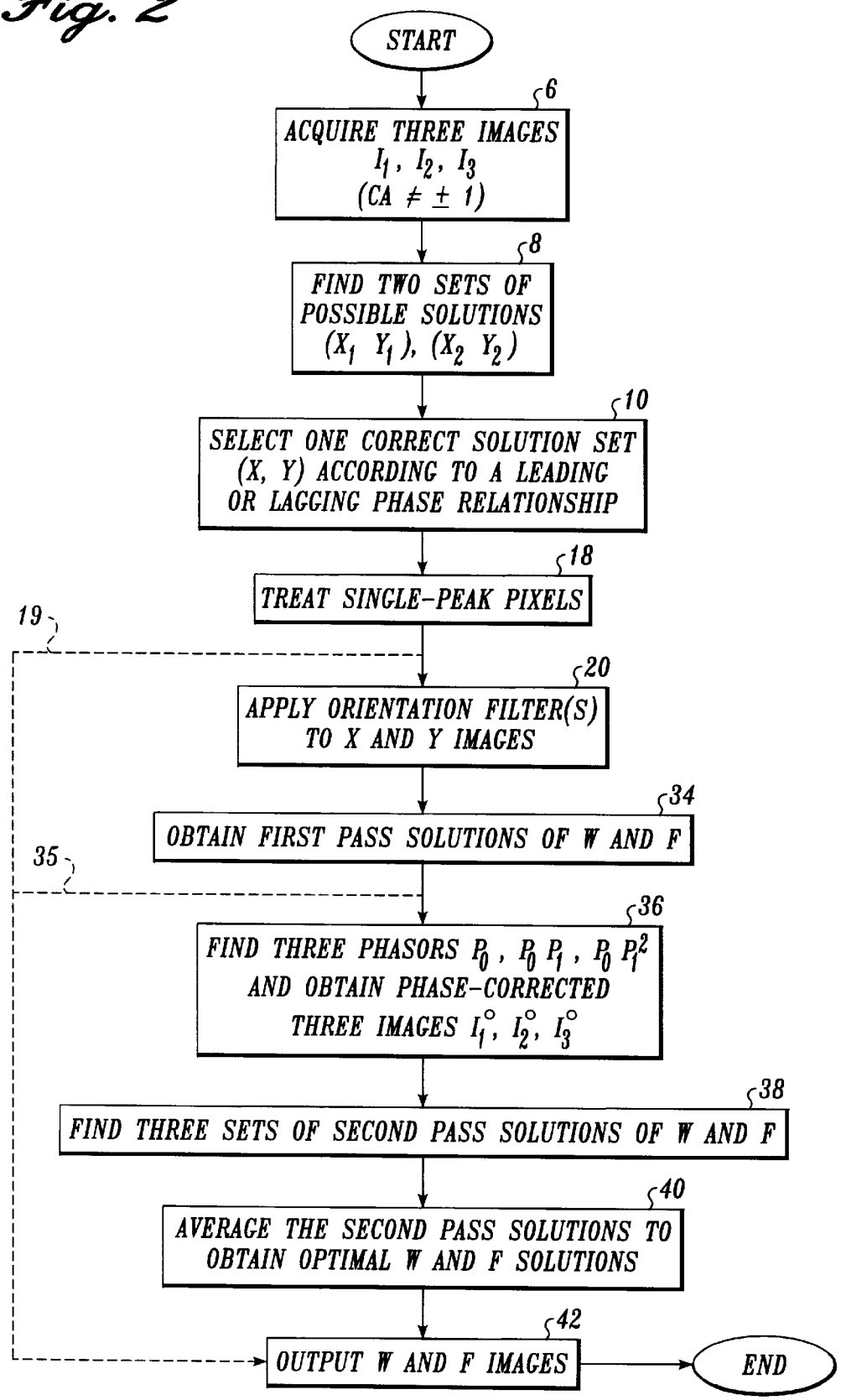

WATER-FAT IMAGING WITH DIRECT PHASE ENCODING (DPE)

CROSS-REFERENCE TO RELATED APPLICATION

The present application claims the benefit under 35 U.S.C. § 119(e) of U.S. provisional application Ser. No. 60/065,394, filed Nov. 13, 1997.

FIELD OF THE INVENTION

This invention relates to Magnetic Resonance Imaging (MRI) and, more particularly, Chemical Shift Imaging (CSI) for producing separate images of different chemical species, such as water and fat.

BACKGROUND OF THE INVENTION

Magnetic Resonance Imaging (MRI) is a medical patient diagnostic technology for noninvasively producing high quality images. In an MRI sequence, a uniform magnetic field, $B_0$, is applied to an imaged object along the z axis of the Cartesian coordinate system. The effect of the $B_0$ magnetic field is to align the object's nuclear spins along the z axis. In response to radio-frequency (RF) pulses of the proper frequency oriented within the x-y plane, the nuclei resonate at their Larmor frequencies according to the following equation:

$$\omega = \gamma B_0 \qquad (1)$$

where $\omega$ is the Larmor frequency and $\gamma$ is the gyro-magnetic ratio which is a property of the particular nucleus.

In the well-known slice selective RF pulse sequence, as illustrated in both FIGS. 1A and 1B, a magnetic field gradient along the z axis, Gz or $G_{slice}$, is applied at the time of the RF pulse so that only the nuclei in a slice through the object in the particular x-y plane are excited to produce induction signals. After the excitation of the nuclei, magnetic field gradients are applied along the x and y axis, and a magnetic resonance (MR) signal is acquired. The gradient along the x axis, Gx or $G_{frequency}$, causes the nuclei to precess at different resonant frequencies depending on their position along the x axis; that is, $G_{frequency}$ spatially encodes the precessing nuclei by frequency. Similarly, the y axis gradient, Gy or $G_{phase}$, is incremented through a series of value and encodes y position into the rate of change in phase as a function of Gy gradient amplitude, a process typically referred to as phase encoding. From this data set, an image may be derived according to well-known reconstruction techniques such as the Fourier transform. It should be noted that it is also possible to obtain three-dimensional volumetric MR images without using slice selection, as known in the art.

When MRI is combined with magnetic resonance spectroscopy, images of different chemical species can be obtained. This procedure is termed Chemical Shift Imaging (CSI) and has great diagnostic values. For example, CSI may be used to obtain separate images of water and fat for each pixel of an imaged object.

Water-fat imaging takes advantage of a slight difference in Larmor frequency between protons in water and fat. Each pixel of a reconstructed image can be modeled with two magnetization vectors representing protons associated with water and fat, respectively. These two vectors are rotating at different angular frequencies with a known difference, or chemical shift, of 3.5 ppm (220Hz at 1.5 T). The two rotating vectors can therefore interfere constructively or destructively, depending on the relative direction or "phase" of the two vectors. The relative phase, or phase shift, of the two vectors can be controlled by adjusting the timing parameters used in an MRI pulse sequence, so that one vector evolves in phase with respect to the other by a certain angle before the image is acquired, as more fully described below. The acquired complex image I, representing the vector field of transverse magnetization in the rotating frame at the time of data acquisition, or at the echo-time (TE), can be written as $$I = [W + exp(i\alpha)F] exp(i\Phi) exp(i\Theta) \qquad (2)$$

where W and F are real and non-negative variables representing the magnitudes of the magnetization vectors of water and fat respectively, $\alpha$ is the phase shift between the two vectors, $\Theta$ is an unknown phase error due to $B_0$ magnetic field inhomogeneity, and $\Phi$ is another unknown phase error which will be discussed in detail below. Relaxation effects are ignored as they can be absorbed into the variables W and F. Both $\alpha$ and $\Theta$ are proportional to a time shift $\Delta t$ in a pulse sequence as follows:

$$\alpha = \Delta\omega \Delta t \qquad (3)$$

where $\Delta\omega$ is the difference in Larmor frequencies between water and fat, or approximately 220 Hz in a 1.5 Tesla (T) polarizing magnetic field $B_0$. (The Larmor frequency of protons in water is approximately 63.9 MHz at 1.5 T, and the Larmor frequency of protons in fat is lower than that by approximately 220 Hz); and $$\Theta = \gamma \Delta B_0 \Delta t \qquad (4)$$

where $\Delta B_0$ is the main magnetic field inhomogeneity. The time shift $\Delta t$ in both equations (3) and (4) is measured from the refocusing time $t_0$ to the echo-time TE, as known in the art. The parameter $t_0$ is defined differently in a spin-echo pulse sequence and in a gradient-echo pulse sequence, as illustrated in FIGS. 1A and 1B, respectively. In a spin-echo sequence, the refocusing time $t_0$ is simply the Hahn echo location determined by the 90° and 180° RF pulses; while in a gradient-echo sequence, the refocusing time to must satisfy $$\Delta\omega t_0 = n 2\pi \quad (n=integer) \qquad (5)$$

In other words, in a gradient-echo sequence to is defined as a time instance at which the water and fat vectors are phase shifted by n $2\pi$ and, thus, pointing in the same direction. Accordingly, in a spin-echo sequence of FIG. 1A, $\Delta t$ can be adjusted by changing the locations of either the 180° RF pulse or the $G_{frequency}$ structure including both a data acquisition window 2 and a readout gradient 4, or both; while in a gradient-echo sequence, $\Delta t$ can be adjusted by simply changing the TE.

The unknown parameter $\Phi$ in equation (2) is a static phase error which is usually attributed to RF field inhomogeneity or data sampling window off-centering as known in the art. Concomitant field components could also contribute to this phase error. If the image is acquired with a gradient-echo sequence, $\Phi$ also contains another major phase error $\Theta = \gamma \Delta B_0$ to due to the main magnetic field inhomogeneity.

In the well known CSI techniques originally proposed by Dixon (hereinafter "Dixon method"), two images are acquired with the water and fat components of the images in phase, and out of phase by $\pi$ radians, respectively. (See W T Dixon, "Simple Proton Spectroscopic Imaging", Radiology, 153, 189 (1984)). Based on equation (3) and that the differential Larmor frequency Δω between water and fat is known to be 3.5 ppm, time shifts Δt for accomplishing these phase shifts can be calculated to be zero and 2.25 ms, respectively, at 1.5 T. The two complex images thus obtained, one with water and fat in-phase and the other with water and fat opposed-phase, can then be written as $$I_1 = (W+F) \exp(i\Phi) \quad (6)$$

$$I_2 = (W-F) \exp(i\Phi) \exp(i\Theta) \quad (7)$$

According to the angle between the W and F vectors, the above described data acquisition method can be termed a (0°, π) or (0°, 180°) sampling scheme. If the phase error Θ is determined, the W and F can be subsequently solved from equations (6) and (7) by simple addition and subtraction of the equations. Since both W and F are non-negative and real, one can write $$2\Theta = Arg[(I_2 I_1^*)^2] \quad (8)$$

where the operator Arg [ ] returns the phase of the complex number in the square bracket, and "*" represents the complex conjugate. From equation (8), Θ can be directly determined provided it is within the range of $|\Theta| < \pi/2$. Due to the periodicity of trigonometric functions, if $|\Theta| < \pi/2$, the measured phase 2Θ of equation (8) "wraps around", as termed in the art and, thus, the actual value Θ cannot be uniquely determined. Because the 3.5 ppm chemical shift between water and fat corresponds to a phase shift of π radians, the condition of $|\Theta| < \pi/2$ implies that the main magnetic field inhomogeneity must be less than 1.75 ppm over an entire field-of-view (FOV). This is a very challenging condition to meet even with careful shimming of the magnet that is used to produce the magnetic field. Furthermore, even if the original $B_0$ field was perfectly homogeneous, once the patient is inserted into the field, the magnetic susceptibility variation of tissues can induce significant field variations, which can well exceed 1.75 ppm. Therefore, the Dixon method typically relies on a successful "unwrapping" of the phase map of 2Θ to obtain an unique value of phase Θ. Phase unmapping methods as currently available, however, are sensitive to noise and artifacts, heavily rely on the spatial continuity of an image and, thus, often become inoperable when tissues in the FOV are imaged as disconnected fragments.

A need exists for a method which can unambiguously resolve separate images of different chemical species based on MR signals. Preferably, such method will not rely on a phase unwrapping method, and will have a high tolerance to noise and artifacts typically encountered in a standard MRI.

SUMMARY OF THE INVENTION

The present invention provides a method of unambiguously decomposing MR images into separate images of different two chemical species, for example water and fat, respectively. The method as applied in resolving water and fat images is termed water-fat imaging with direct phase encoding (hereinafter "DPE").

The method acquires three complex images whose respective phase differences between the chemical species, e.g., water and fat components, are $\alpha_0$, $\alpha_0+\alpha$, and $\alpha_0+2\alpha$, respectively. The method obtains from these three complex images two possible solution sets for the different chemical species images. For pixels with both chemical species components, one correct solution set is selected using a binary choice based on the relative Larmor frequency of each chemical species. Thus, the method unambiguously resolves pixels with two components. If a pixel contains only one component, a known statistical bias is applied to identify the component and, thus, the pixel. In the case of imaging water and fat components in living tissues, pixels with only one component are assumed to be one chemical species, namely water, because a voxel containing pure fat is not realistic in living tissues. The water and fat solutions obtained from the three complex images may be used to directly produce two chemical species, i.e., water and fat images.

Because there may be misidentified pixels having only one component, in accordance with other aspects of this invention, misidentified pixels are corrected by applying various filters to all of the pixels. One suitable filter, a global orientation filter (GOF), involves a repeated region growing process from many seeds randomly distributed in the FOV. Another suitable filter, a local orientation filter (LOF), uses a small sliding window and compares the orientation vector of a central pixel with the mean value of orientation vectors in the window. When a sampling scheme involves a quadrature sampling in the middle acquisition, for example (0°, 90°,180°), a spin reversal filter (SRF) may be used in place of a GOF.

In accordance with other aspects of this invention, the solutions are substituted back into the original three complex image equations to produce second pass solutions. The second pass solutions may be further averaged in a simple or an optimal manner to obtain a maximum possible signal-to-noise ratio (SNR). Finally, completely resolved chemical species, i.e., water and fat images are produced.

As a special case of the general DPE described above, the present invention also provides a three orthogonal-phase acquisition method (hereinafter "TOP"). TOP is used when three complex images are acquired such that in all three acquisition points, magnetization vectors of two chemical species, for example water and fat, are orthogonal to each other, as in (−90°, 90°, 270°) and (90°, −90°, −270°). The TOP image acquisition scheme produces stable image solutions and has a strong phase error tolerance. For pixels with both chemical species components, TOP obtains from these three complex images two possible solution sets for the chemical species images. As before, TOP unambiguously selects one solution set based on the known difference in Larmor frequencies associated with the two components. If a pixel contains only one component, a known statistical bias is applied as before. To correct misidentified pixels with only one component, various filters described above may be applied to the entire pixels. Also as before, the chemical species, e.g., water and fat solutions obtained from the three complex images may be used to directly produce chemical species images, or may be substituted back into the original three complex image equations to produce second pass solutions. Again, the second pass solutions may be further averaged. Finally, completely resolved chemical species images are produced.

Because DPE of the present invention samples the rotating magnetization vectors of two chemical species, for example water and fat, not only at parallel or anti-parallel but also at other angles, it breaks the symmetry between the two components and resolves their images on a pixel-by-pixel basis unambiguously. DPE can not only adequately separate the two components, but also identify which image is which chemical species—water or fat.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein:

FIG. 2 is a flowchart illustrating the method of the present invention for acquiring three MR images and producing two separate images of two chemical species;

DETAILED DESCRIPTION OF THE PREFERRED EMBODIMENT

Though the following describes the method of the present invention as applied in separation of water and fat images, it should be understood that the method is equally applicable to separating other chemical species with a known chemical shift. Further, though the following describes the present invention in a standard spin-echo sequence or a gradient-echo sequence application, it should be understood by those skilled in the art that the present invention can be implemented using other pulse sequences.

I. Direct Phase Encoding (DPE) method.

FIG. 2 is a flowchart illustrating a preferred method of acquiring three MR images containing both water and fat components and producing two separate images of water and fat according to the present invention. The following describes the steps included in the method illustrated in FIG. 2.

A) Acquiring three images.

Figure 1A:
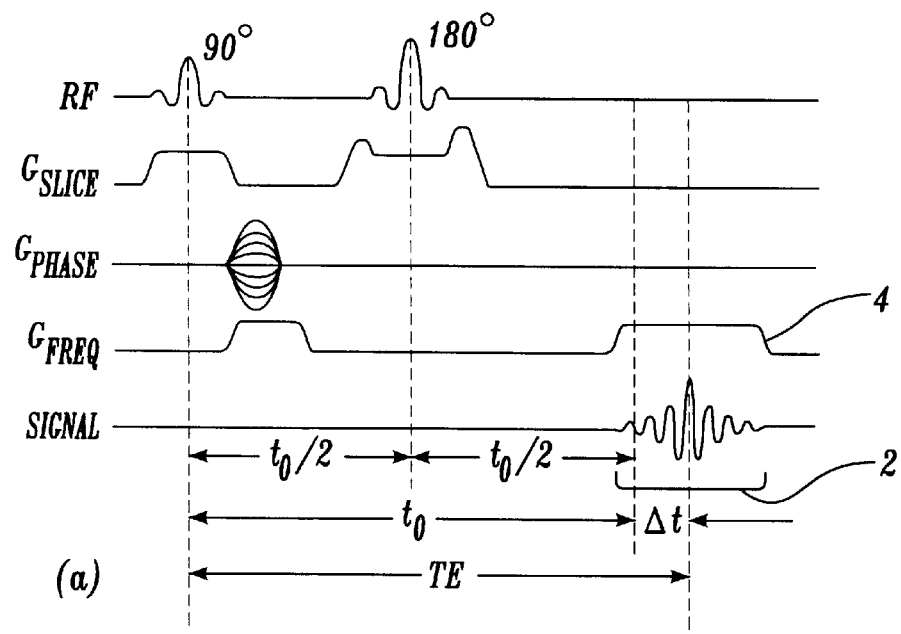
FIG. 1A illustrates a spin-echo pulse sequence, including a graphical definition of a refocusing time to, an echo-time TE, and a time shift $\Delta t$ as applied in the spin-echo sequence, suitable for use in understanding the present invention.
Figure 1B:
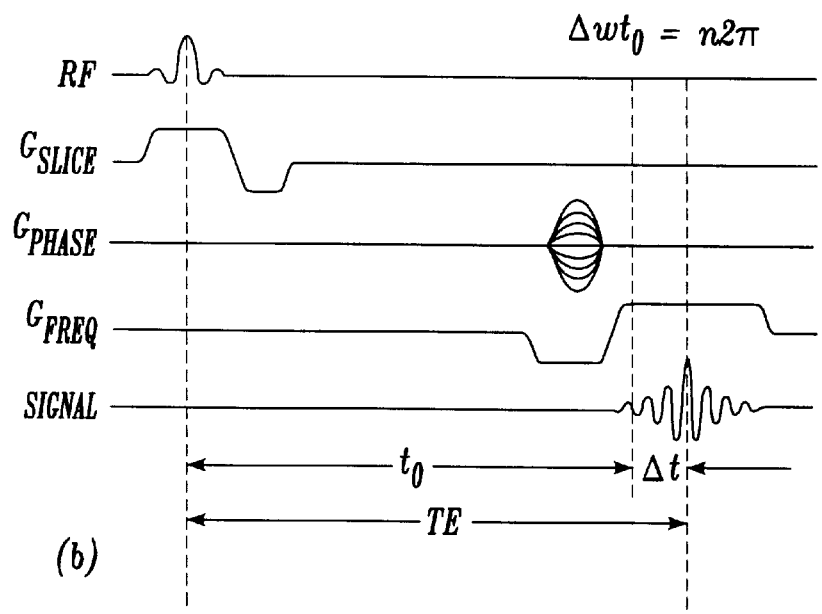
FIG. 1B illustrates a gradient-echo pulse sequence, including a graphical definition of a refocusing time to, a echo-time TE, and a time shift $\Delta t$ as applied in the gradient-echo sequence, suitable for use in understanding the present invention.

The first step of the method is to acquire three MR images. See process block 6 in FIG. 2. Referring to FIGS. 1A and 1B, suitable pulse sequences with their respective time shifts $\Delta t = \tau_0$, $\tau_0 + \tau$, and $\tau_0 + 2\tau$, are used to acquire three complex images, wherein the phase shifts between water and fat components are $\alpha_0$, $\alpha_0 + \alpha$, and $\alpha_0 + 2\alpha$, respectively. The method of image acquisition, including adjusting timing parameters to adjustably vary phase shifts between two chemical species is well known in the art, as described above in the Background section. In selecting three time shifts $\Delta t = \tau_0$, $\tau_0 + \tau$, and $\tau_0 + 2\tau$, $\tau_0$ and $\tau$ should be chosen so as to satisfy the following condition:

$$exp(i\Delta\omega\tau_0)exp(i\Delta\omega\tau) \neq \pm 1 \quad (9)$$

for the reasons which will become apparent later.

The three complex images thus obtained can be expressed as $$I_1 = (W + CF)P_0 \quad (10)$$

$$I_2 = (W + CAF)P_0P_1 \quad (11)$$

$$I_3 = (W + CA^2F)P_0P_1^2 \quad (12)$$

where C and A are known complex phase factors or "phasors" due to chemical shift, defined as $$C = exp(\Delta\omega\tau_0) = exp(i\alpha_0) \quad (13)$$

$$A = exp(i\Delta\omega\tau) = exp(i\alpha) \quad (14)$$

and $P_0$ and $P_1$ are unknown phasors representing phase errors, which can be written as $$P_0 = exp(i\Phi)exp(i\gamma\Delta B_0\tau_0) \quad (15)$$

$$P_1 = exp(i\gamma\Delta B_0\tau) \quad (16)$$

B) Obtaining two solution sets for pixels with two components.

Referring to process block 8 in FIG. 2, based on the three complex images thus obtained, two possible solution sets for water and fat components are obtained. For simplicity, two new complex variables X and Y are introduced and defined as follows:

$$X = W\,P_0\,P_1 \quad (17)$$

$$Y = C\,A\,F\,P_0\,P_1 \quad (18)$$

W and F are the magnitudes of vectors X and Y. From equations (10–12):

$$I_2 = X + Y \quad (19)$$

$$I_1 I_3 = X^2 + Y^2 + XY(A + 1/A) \quad (20)$$

From equations (19, 20), the following two solution sets for vectors X and Y are obtained:

$$\begin{cases} X_1 = \dfrac{I_2 + \Delta I}{2} \\ Y_1 = \dfrac{I_2 - \Delta I}{2} \end{cases} \quad (21)$$

$$\begin{cases} X_2 = \dfrac{I_2 - \Delta I}{2} \\ Y_2 = \dfrac{I_2 + \Delta I}{2} \end{cases} \quad (22)$$

where ΔI is defined as $$\Delta I = \frac{\sqrt{(A+1)^2 I_2^2 - 4AI_1 I_3}}{A-1} \qquad (23)$$

C) Selecting one correct solution set.

Figure 3:
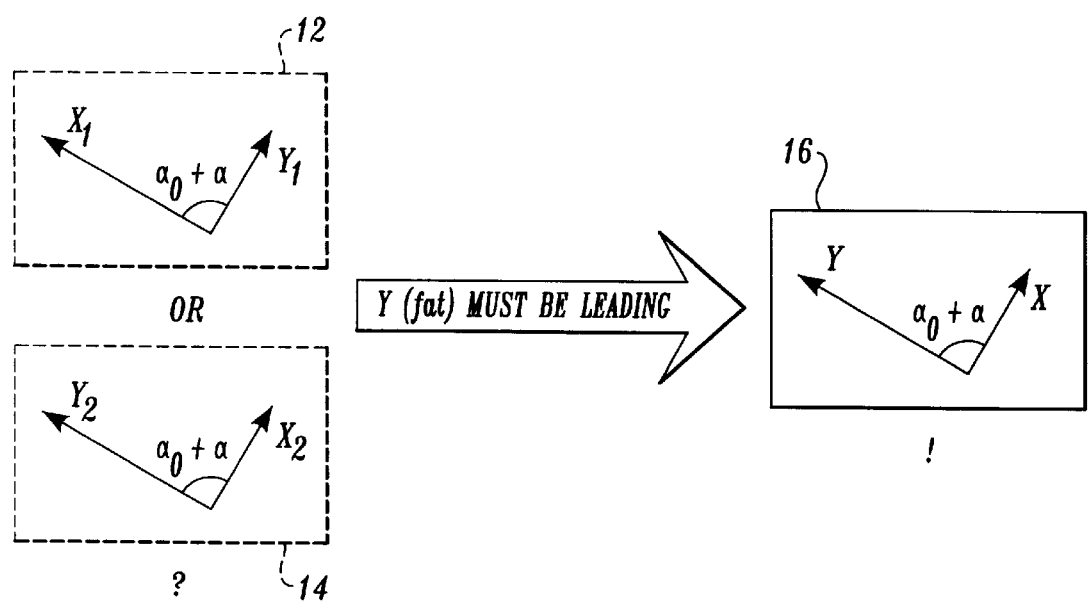
FIG. 3 is a diagram illustrating a method for selecting a correct solution set of X and Y based on a known phase shift between X and Y in accordance with the present invention.

Either solution set (21) or solution set (22) is correct. Due to the square-root operation included in equation (23), equations (21) and (22) include a symmetric ambiguity, namely, $X_1=Y_2$ and $Y_1=X_2$. This ambiguity can not be resolved from equations (19, 20) because they too include a symmetric ambiguity regarding X and Y. Referring to process block 10 in FIG. 2, the ambiguity can be clearly solved, however, in reference to the definition of X and Y in equations (17, 18), provided CA≠±1, or equation (9) is fulfilled. If CA is not 1 or −1, according to equations (17, 18), there exists a definite phase shift relationship between the two vectors X and Y. Namely, the vector X either takes a leading or lagging position relative to the vector Y, depending on the timing parameter Δt. Referring to FIG. 3, for example, if Δt is so chosen that CA=i, or the angle $\alpha_0+\alpha$ is 90°, there are two possible phase relations between vectors X and Y: vector X may be leading vector Y by 90° as illustrated in a box 12, or vector X may be lagging behind vector Y by 90° as illustrated in a box 14. It is known that the Larmor frequency of protons in fat is lower than that of protons in water by approximately 220 Hz. Accordingly, the correct solution set can be unambiguously chosen as the one wherein the vector Y associated with fat is leading the vector X, as illustrated in a box 16. Once the correct solution set is selected as either equation (21) or (22), W and F can be obtained as the magnitudes of the vectors X and Y.

Accordingly, the relative phase relationship between the two vectors X and Y, together with a knowledge of Larmor frequencies associated with these vectors, allows an unambiguous determination of two chemical species, water and fat components in the present example, directly from the three complex equations. Pixels which contain both fat and water components are unambiguously resolved.

D) Treating pixels with a single component.

If only a single component exists in a pixel, or if a smaller peak representing a component having a smaller magnitude is so small that it is embedded in the noise, relative relationship between two peaks may not be ascertained. As a result, X and Y cannot be directly determined as described above. In such cases, the present method simply deternines these one-component pixels to be pure water because a pixel containing pure fat is not realistic in living tissues. Specifically, as shown in process block 18 of FIG. 2, the method compares the magnitudes of X and Y. If one is less than a small fraction (between about 5% and about 12%, for example 8%) of the other, the longer vector will be determined as X (water). When the present method is used in resolving two images of any other two chemical species, similar statistical bias may be introduced to make a similar determination.

At this point, solutions of W and F, taken as the magnitudes of X and Y, are obtained for all the pixels in the FOV, and may be directly used to produce water and fat images as shown by dashed line 19 in FIG. 2.

E) Applying orientation filter(s).

The steps described above in Sections A) through D) can often lead to a nearly satisfactory result, with most pixels being correctly resolved. All pixels with two components, each constituting a substantial peak, are unambiguously resolved. However, some pixels with only one component, or with one component substantially less than the other component, may have been misidentified to have a reversed water-fat assignment. This can be corrected by applying an orientation filter to both X and Y images, as shown in process block 20 in FIG. 2. An orientation filter compares every pixel with its neighbors, and corrects misidentified pixels with a swapped X-Y assignment based on an assumption that the complex phasors $P_0$ and $P_1$, although unknown, are usually smoothly changing functions. As described more fully below, various types of orientation filters such as a local orientation filter (FIG. 4), a global orientation filter (FIG. 5), or spin reversal filters (FIGS. 6A and 6B) can be used. In each of the orientation filters, correctly resolved pixels, most of which are pixels with two components, are used as bases to correct misidentified pixels with only one component.

E1) Local orientation filter (LOF)

Figure 4:
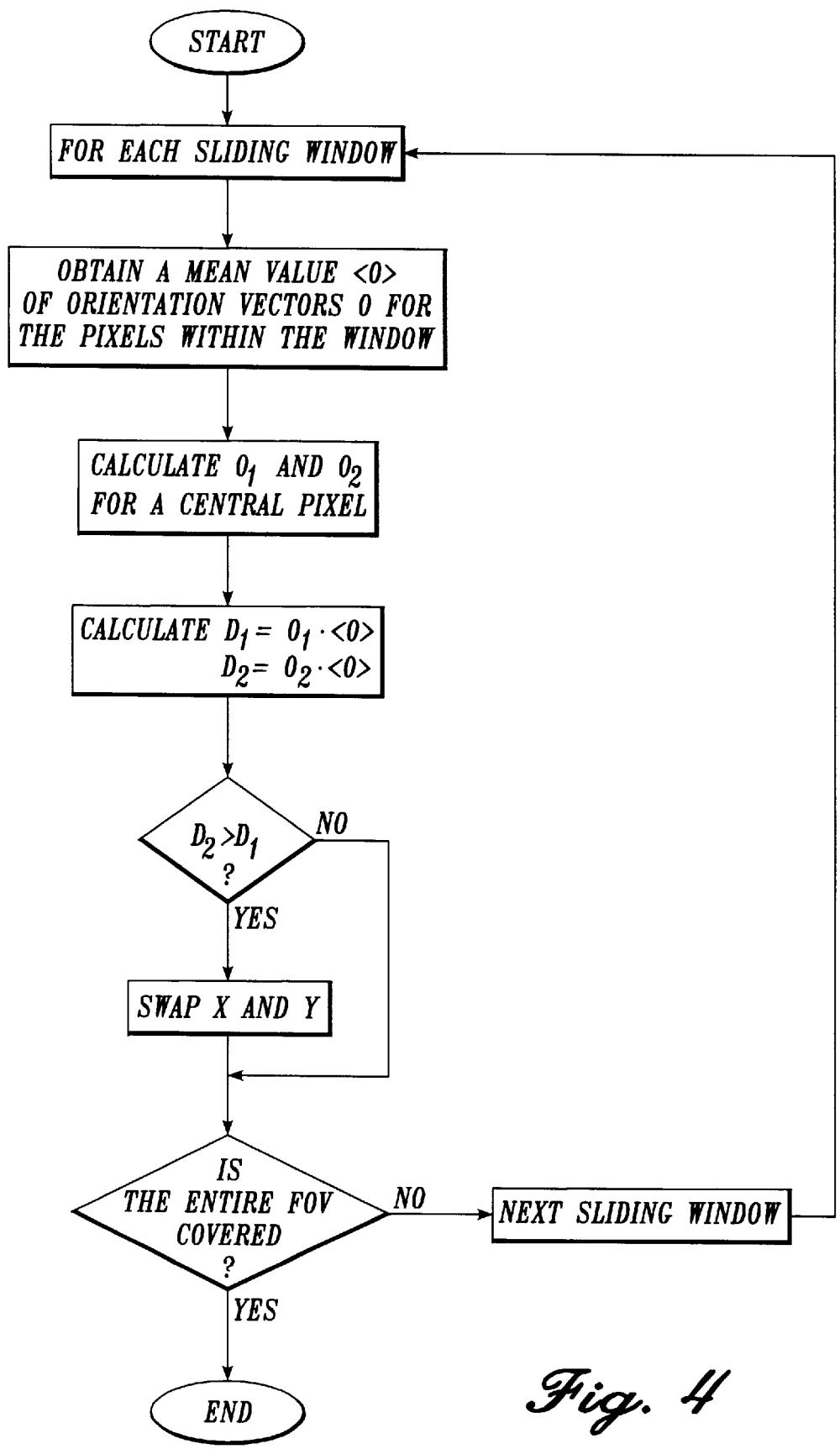
FIG. 4 is a flowchart illustrating the operation of a local orientation filter (LOF) suitable for use in embodiments of the present invention.

The operation of a local orientation filter (LOF) suitable for use in embodiments of the present invention is illustrated in flowchart form in FIG. 4. An LOF utilizes that the product of the unknown phasors $P_0 P_1$ is a unit vector field. According to equations (11, 17–18), an orientation vector O field which is parallel to $P_0 P_1$ can be defined as $$O=X+Y/(CA) \qquad (24)$$

where X and Y are the original images to be filtered. Because $P_0 P_1$ should be changing smoothly, the orientation vector field O should also change its direction smoothly. In a sliding window (typically with 5×5 or 7×7 pixels, but can be expanded into 21×21), the mean value of the orientation vector <O> is first evaluated, then two possible orientation vectors $O_1$ and $O_2$ are computed at the central pixel within the window as $$O_1=X_{central}+Y_{central}/(CA) \qquad (25)$$

$$O_2=Y_{central}+X_{central}/(CA) \qquad (26)$$

These two orientation vectors are compared with <O> by computing two dot products as $$D_1=O_1\cdot<O>=Real(<O_1>)Real(<O>)+Imag(O_1)Imag(<O>) \qquad (27)$$

$$D_2=O_2\cdot<O>=Real(<O_2>)Real(<O>)+Imag(O_2)Imag(<O>) \qquad (28)$$

If $D_2$ is greater than $D_1$, then X and Y are swapped at the central pixel, since $O_2$ agrees better with <O> and, thus, should be the correct orientation vector of the central pixel. Otherwise, the central pixel remains unchanged. The process described above repeats itself until the sliding window covers the entire FOV.

E2a) Global orientation filter (GOF)

Sometimes, the original X and Y images are not ideal but are locally contaminated by artifacts or unknown factors, which degrades the performance of an LOF. In such a situation, a global orientation filter (GOF) which utilizes information from more distant pixels within the FOV may be used to correct misidentified pixels. The operation of a GOF suitable for use in embodiments of the invention is illustrated in flowchart form in FIG. 5.

Figure 5:
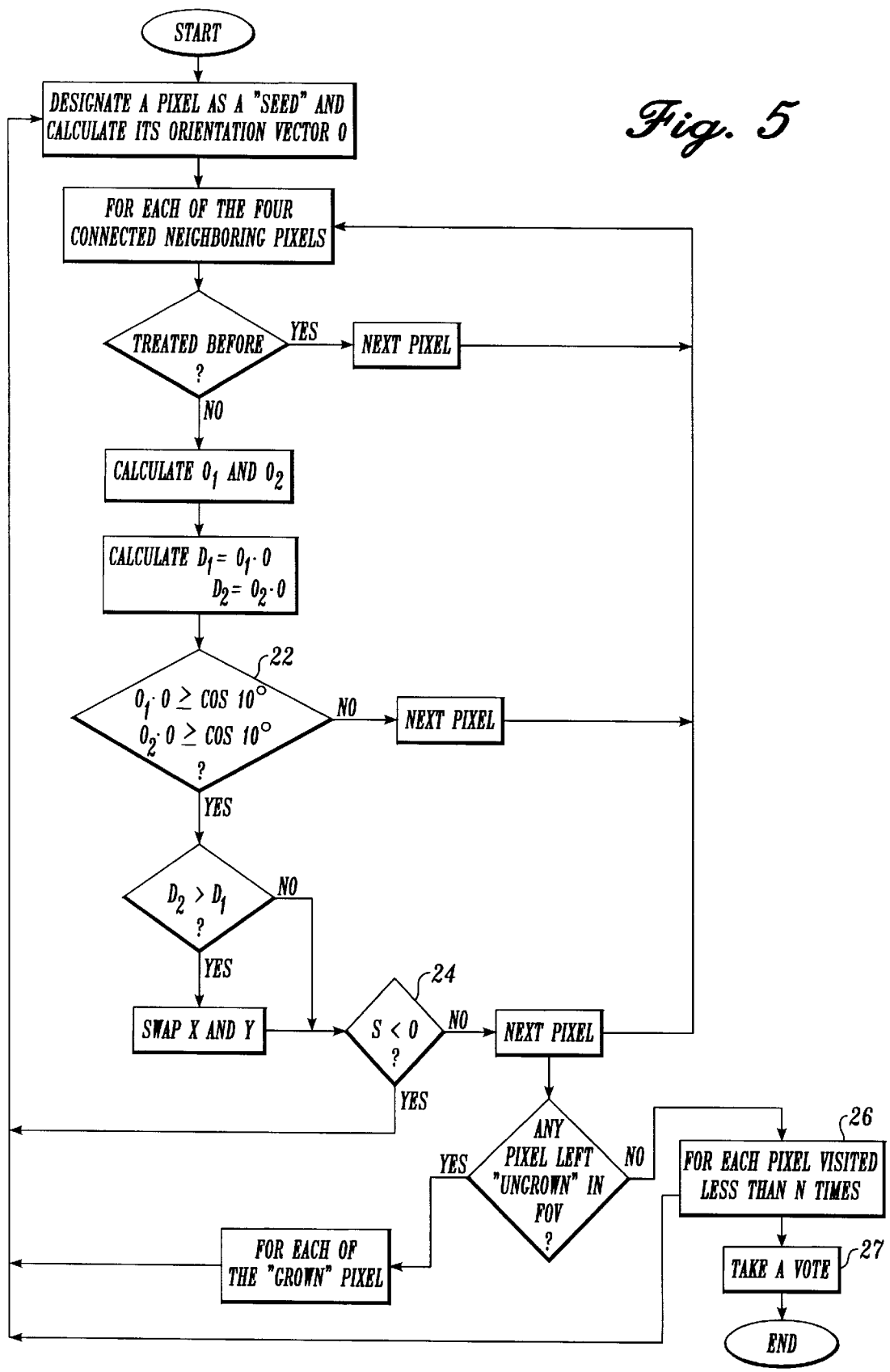
FIG. 5 is a flowchart illustrating the operation of a global orientation filter (GOF) suitable for use in embodiments of the present invention.

Referring to FIG. 5, initially, a pixel is chosen at random as a "seed" and its orientation vector O defined by equation (24) is computed. Two orientation vectors $O_1$ and $O_2$ as in equations (25, 26) are computed for each of the four connected neighboring pixels that surround the seed pixel. Each set of $O_1$ and $O_2$ are compared with the orientation vector O of the seed pixel, by computing the dot products $D_1$ and $D_2$ as described in equations (27, 28). As before, if $D_2$ is greater than $D_1$, X and Y vectors are swapped. Otherwise, X and Y vectors remain unchanged. After all the four connected neighboring pixels are thus treated, or "grown", they are used as new seeds for growing their respective four connected neighboring pixels. The "grown" pixels will not be treated again. This process continues until no more pixels can be "grown" in the FOV.

To prevent growing in the background noise, a phase coherence test may be used in the growing process, as in process block 22 of FIG. 5. Specifically, the phase coherence test requires one of the two orientation vectors $O_1$ and $O_2$ of a new pixel be within a ±10° range, or any other suitable threshold range, of the orientation vector O of the seed pixel O. If not, the new pixel will not be grown. The range is chosen so as to tolerate the impact of noise and artifacts on the solutions X and Y, as well as the finite line width of fat in the chemical shift spectrum. It should be understood that those skilled in the art may readily ascertain an optimal range value for each specific application of the present method.

Referring to process block 24 of FIG. 5, to monitor the operation of a GOF, a "score of consistency" may be accumulated as $$S_{n+1} = \begin{cases} S_{n+1} & \text{if } X \text{ and } Y \text{ are not swapped at the } n+1\text{th pixel} \\ S_{n-1} & \text{if } X \text{ and } Y \text{ are swapped at the } n+1\text{th pixel} \end{cases} \quad (29)$$

where $S_n$ and $S_{n+1}$ are the "score of consistency" after the nth and n+1th pixel are grown, respectively. S reflects the reliability of the original X and Y solutions at the seed, as well as the performance of the growing process. For instance, if the seed is a "bad" pixel being contaminated with artifacts, or there is a mistake in the growing process, a large number of X-Y swaps will result due to the data inconsistencies and the score S will be low. On the other hand, if the seed is a "good" pixel with reliable X and Y solutions, or there is no mistake during growing, there will be less (X,Y) swaps and the score S will be high. If at any step the score S becomes negative, the growing process is considered invalid and terminated, and will be started again with a new seed.

Referring to process block 26 of FIG. 5, the entire growing process may be repeated with many different seeds. New seeds are chosen at random from all pixels in the FOV so that every piece of isolated tissue is covered. In this regard, a predetermined integer N (e.g. N=7) may be used to limit the processing time; each pixel is limited to grow up to N times. Thus, at the end of all the valid growths, each pixel has been treated, or grown, for N times. Referring to process block 27, from N number of results, a "vote" is taken for each pixel to decide whether the original X and Y values should be swapped or not. X and Y are swapped if more than half votes indicate so. Thus, the number N should be an odd integer to avoid a tie in the vote.

Theoretically, a GOF is based on an assumption that more than half the pixels on each isolated piece of tissue are correctly resolved in the original X and Y images. Usually, this is a sound assumption because many pixels in tissue include both water and fat components and, thus, unambiguously resolved by the present method in process box 10 of FIG. 2.

Because a GOF uses the global statistical properties of the original X and Y images, it is much less sensitive to local image artifacts than an LOF. In practice, therefore, an application of a GOF followed by an LOF would be an effective way of filtering the X and Y images.

E2b) Spin reversal filter (SRF)

Although a GOF described above has been tested and proven to be quite effective for a general DPE sampling scheme ($\alpha_0$, $\alpha_0+\alpha$, $\alpha_0+2\alpha$), two practical challenges remain. First, if a pixel selected as an original seed includes a wrong X-Y assignment, an invalid growing process will follow before a successful growth can be found. Any invalid growth consumes some precious processing time. Second, though the ±10° range used in the phase coherence test of process block 22 in FIG. 5 has been found to be effective in most cases, it is often difficult to select a single optimal threshold angle for different imaging sequences or on different scanners.

Figure 6A:
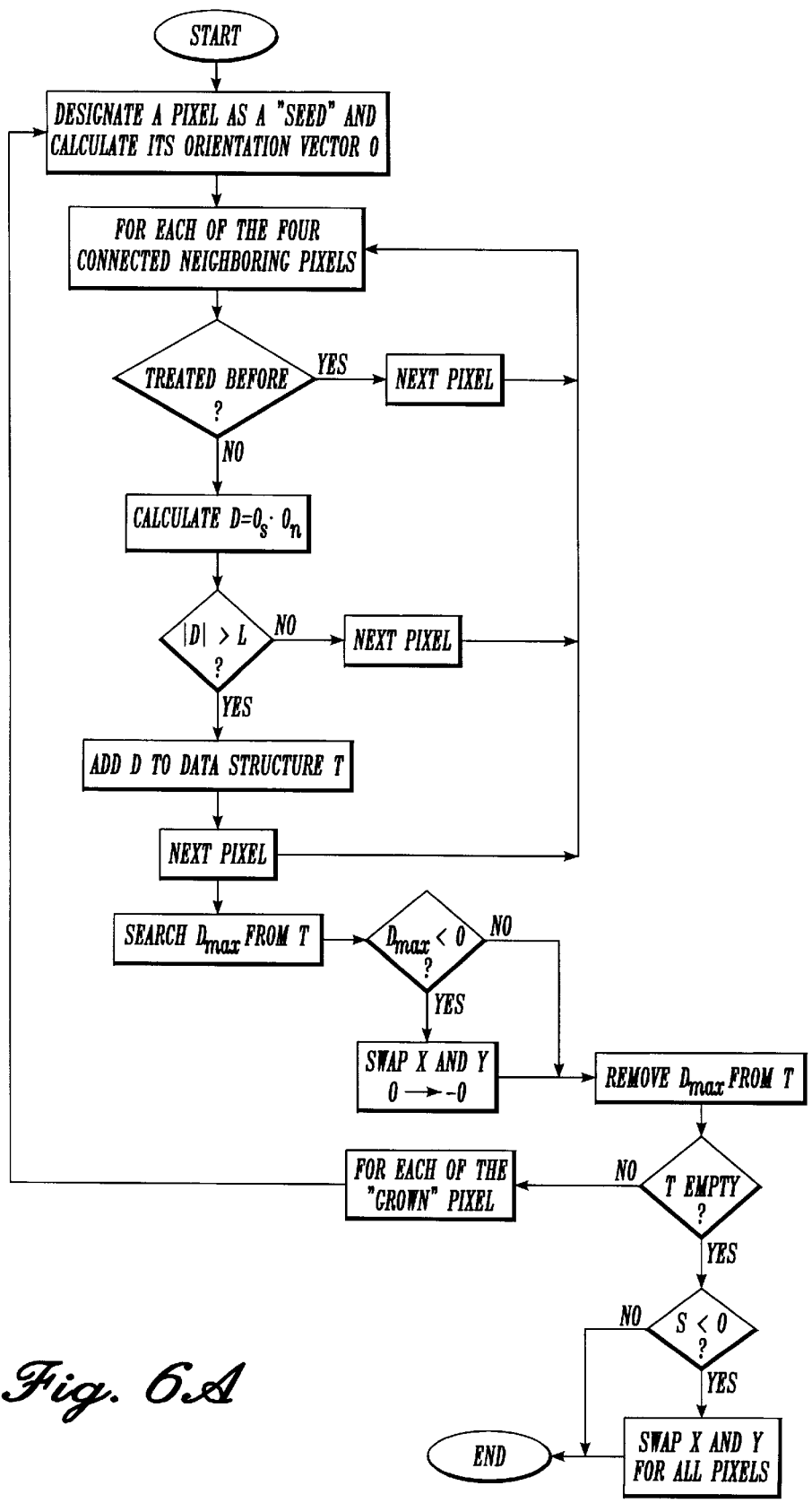
FIG. 6A is a flowchart illustrating the operation of an embodiment of a spin reversal filter (SRF) suitable for use in embodiments of the present invention.
Figure 6B:
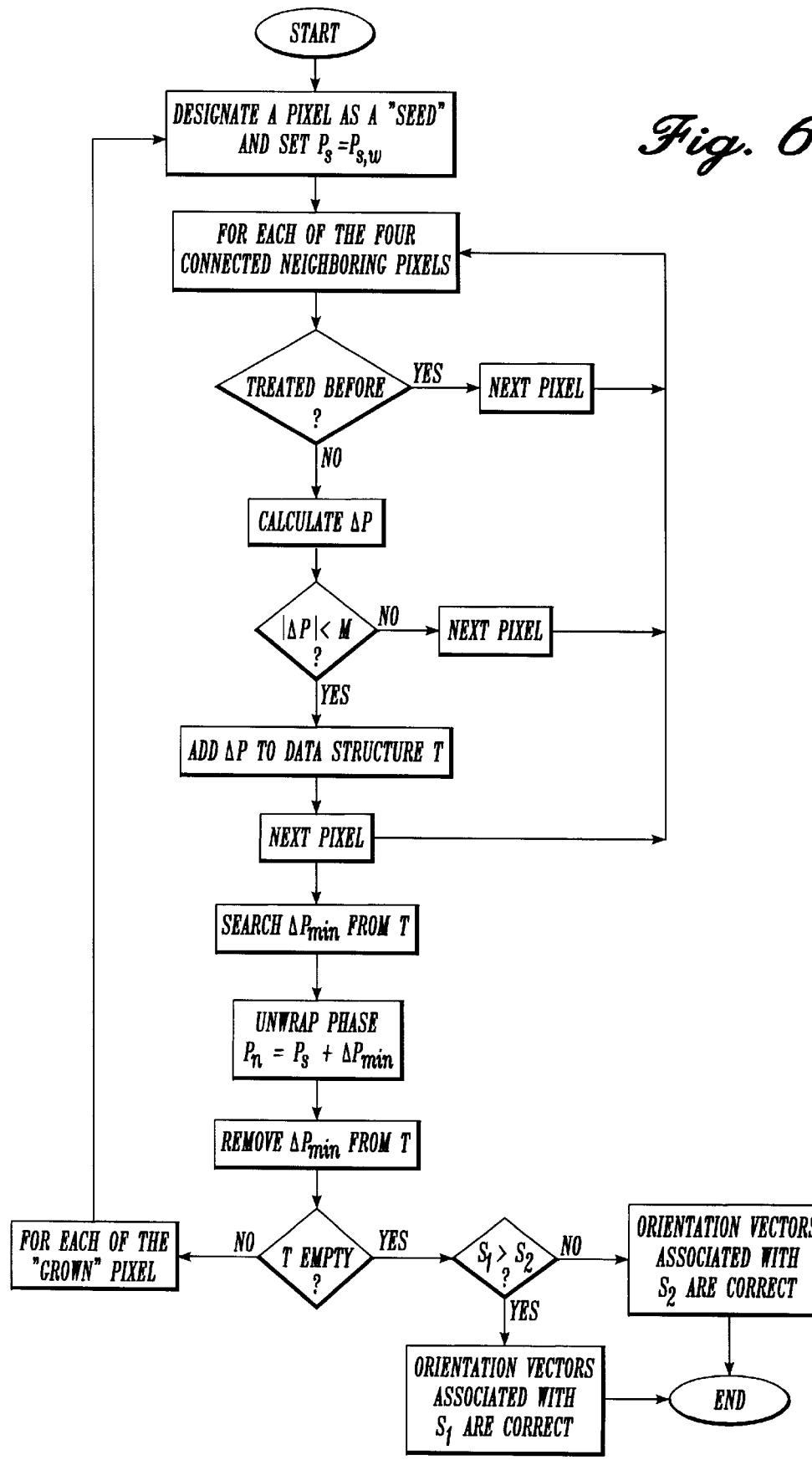
FIG. 6B is a flowchart illustrating the operation of another embodiment of a spin reversal filter (SRF) suitable for use in embodiments of the present invention.

FIGS. 6A and 6B illustrate, in flow diagram form, operation of another orientation filter, a spin reversal filter (SRF) suitable for use in embodiments of the present invention. An SRF is a type of a global orientation filter which can be used when three complex images $I_1$, $I_2$, and $I_3$ are obtained so that the second image $I_2$ is a quadrature image, i.e. CA=i or CA=−i. For example, a sampling scheme (0°,90°,180°) satisfies this condition. As described below, an SRF may be used to solve both of the two challenges discussed above. In an SRF, a normalized orientation vector O is defined as $$O=phasor(X^2-Y^2) \quad (30)$$

where the phasor( ) operator normalizes the magnitude of the complex number in the bracket to 1. From the definitions of X and Y in equations (17, 18), O is found to be $$O=phasor[(W^2+F^2)P_0^2P_1^2]=P_0^2P_1^2 \quad (31)$$

As discussed above, $P_0$ and $P_1$ are usually smoothly changing functions and, thus, O will be a spatially smooth phasor map if the (X,Y) assignments are correct for all the pixels. If a pixel has a wrong (X,Y) assignment, however, O will experience a sudden reversal because the orientation vector O will then be equal to $-P_0^2P_1^2$. An SRF operates to correct wrong (X,Y) assignments by monitoring, and eliminating, sudden reversals of O. The present invention offers generally two embodiments of an SRF, as illustrated in FIGS. 6A and 6B, respectively.

FIG. 6A illustrates a first embodiment of an SRF, wherein the SRF is applied directly on the orientation vector O. Initially, an arbitrary pixel in the FOV is chosen as a seed. For each of the four connected neighboring pixels, orientation vector $O_n$ is calculated, and a dot product between $O_n$ and the orientation vector of the seed $O_s$ is computed as $$D=O_s \cdot O_n = real(O_s)real(O_n)+imag(O_s)imag(O_n) \quad (32)$$

If absolute value of the dot product |D| is greater than a threshold value L (e.g. L=0.95), i.e. $O_s$ and $O_n$ align in near parallel or anti-parallel direction, D is added to an initially empty data structure T. Thus, up to four dot products at maximum can be added to the data structure T during the growth of one seed. Next, a dot product with maximum absolute value, $D_{max}$, is searched out from the data structure T and the neighboring pixel that produced the $D_{max}$ is identified. If $D_{max}$ is positive, the pixel is grown with its X and Y values unchanged. If $D_{max}$ is negative, X and Y values of the pixel are swapped and, further, its O is reversed to −O. Once grown, the seed is labeled to be "visited" to prevent from being visited again in the future growth. Also, $D_{max}$ is removed from the data structure T. The newly grown pixel, in turn, becomes a seed for the next round of growth. In each round of growth except the first one, zero to three dot products between a seed and its neighboring pixels that have not been "visited" can be added to the data structure T. Then, $D_{max}$ is searched out from T and the associated pixel is grown, and the newly grown pixel becomes a seed for the next round of growth. This growing process continues until T becomes empty. After the growing process stops, all the grown pixels constitute a region. Within this region, the orientation vectors for all the pixels are consistent with that of the original seed since the inconsistent orientation vectors have been reversed. Nevertheless, the orientation vector of the original seed is not guaranteed to be correct and, as a result, the orientation vectors for all the pixels in the region could be all wrong. Hence, a binary choice should be made for the entire region, whether to keep the orientation vectors for all the pixels unchanged or to reverse them all. A consistency score has been accumulated as $$S_{n+1} = \begin{cases} S_n + R_n & \text{if } O \text{ is not reversed at the } (n+1)\text{th pixel} \\ S_n - R_n & \text{if } O \text{ is reversed at the } (n+1)\text{th pixel} \end{cases} \quad (33)$$

where $S_n$ and $S_{n-1}$ are the consistency scores after the nth and (n+1)th pixels are grown, respectively. $R_n$ indicates the reliability of the original (X,Y) assignment for the nth pixel. $R_n$ can be simply set to be 1 for every pixel. Preferably, $R_n$ is chosen to be the smaller of |X| and |Y|, since the smaller component is more vulnerable to be affected by noise and artifacts and, hence, more crucial in determining the reliability of the original (X,Y) assignment. If the consistency score S for the region is greater than or equal to zero, the orientation vectors keep unchanged. If S is less than zero, the orientation vectors are all reversed and (X, Y) assignments are swapped for all the pixels in the region. This binary choice for the region is based on the assumption that most of the pixels have initially been given correct (X,Y) assignments and, thus, there should not be many reversals for the orientation vectors. If many reversals occur, it means that the original seed for the region had a wrong (X,Y) assignment resulting in all the correct (X,Y) assignments in the region being swapped. Unlike in a general GOF described above, in an SRF, the result of all growth can be used even if the consistency score S becomes less than zero. Therefore, in an SRF, there is no "invalid" growth which consumes precious processing time.

A region usually covers one piece of isolated tissue. There can be many pieces of isolated tissue in the whole FOV. Thus, the growing process preferably is repeated many times to cover the entire FOV, with virtually every pixel in the FOV being a candidate for an original seed. To be qualified as an original seed, the candidate must not have been visited by previous growths, so that each region can be grown only once.

Two aspects of an SRF are worth noting. The first aspect is the specific data structure of T. The search speed of the data structure T largely determines the speed of the whole filtering process. Preferably, T is a Red-Black Tree, as known in the art, which is a balanced binary search tree (see T. H. Cormen et al., "Introduction to Algorithms", The MIT Press, (1990)). Red-Black Tree is very fast in its search speed and relatively easy to program. The time complexity of searching the maximum or minimum value in a Red-Black Tree is $O(\log_2 n)$, where n is the number of nodes on the tree.

Figure 7:
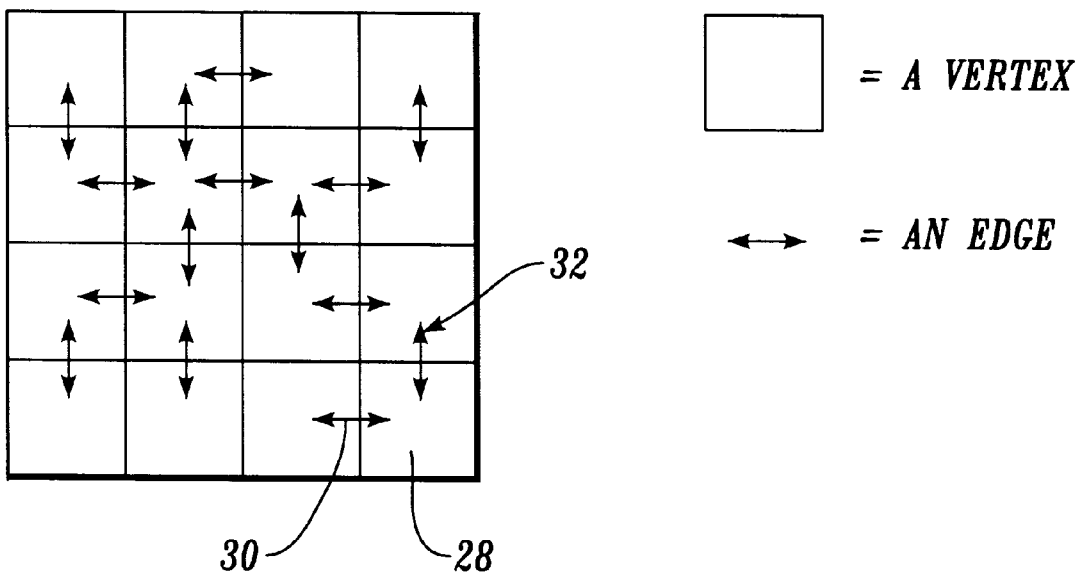
FIG. 7 is a diagram of a typical "spanning tree" in a graph, illustrating a growing path of the spin reversal filter (SRF)

The second aspect of an SRF is that its growing path constitutes a minimum spanning tree (MST) for the region. In a graph theory, a graph G=(V,E) consists of a set of vertices V=[$v_1$, $v_2$, . . . ] and another set of edges E=[$e_1$, $e_2$, . . . ]. Referring to FIG. 7, as applied in an SRF, each pixel 28 in an image is considered as a vertex and a link 30 between two connected pixels is considered as an edge. A tree is a connected graph without any circuits. A spanning tree 32 in a graph G is a tree connecting all the vertices of graph G, or pixels 30 in the image of FIG. 7, without any circuits. In a weighted graph, a weight is associated with each edge. The weight of a spanning tree is defined as the sum of the weights of all branches in the tree. If the weight of a spanning tree is minimum among all the spanning trees in the graph, this spanning tree is called a minimum spanning tree. It has been found that the growing path in the SRF process is actually a minimum spanning tree (MST) for the region if the weight for each edge w is defined as $$w = \frac{1}{1+|D|} \quad (34)$$

The growing method used in an SRF belongs to the category of Prim's algorithm as known in the art for generating a MST. The difference between the MST in the SRF and a general MST is that an SRF uses the threshold value L described above to generate a regional minimum spanning tree (RMST), or the data structure T, for the entire FOV. It has been proved by experiments that the result of the SRF with RMST is highly consistent no matter which pixel is chosen as the original seed of the region. RMST serves to solve the second challenge associated with the general GOF, i.e., the difficulty in finding an optimal threshold angle for the phase tolerance test, as described above.

Referring to FIG. 6B, a second embodiment of an SRF in accordance with the present invention is next described. The SRF illustrated in flow diagram form in FIG. 6B takes advantage of a regional minimum spanning tree (RMST) phase unwrapping method. A wrapped phase map $P_w$ for $O_2$ is calculated as $$P_w = arg(O^2) \quad (35)$$

The wrapped phase map $P_w$ can be unwrapped by using a RMST. Initially, an arbitrary pixel in the FOV is chosen as a seed and its unwrapped phase, $P_s$, is simply set to be its wrapped phase $P_{w,s}$. Four phase differences between the seed and its four connected neighboring pixels are computed, with each of the phase difference $\Delta P$ being defined as $$\Delta P = W(P_{w,n} - P_{w,s}) \quad (36)$$
$$= \begin{cases} P_{w,n} - P_{w,s} + 2\pi & \text{if } P_{w,n} - P_{w,s} < -\pi \\ P_{w,n} - P_{w,s} - 2\pi & \text{if } P_{w,n} - P_{w,s} > \pi \\ P_{w,n} - P_{w,s} & \text{otherwise} \end{cases}$$

where W( ) returns the principle value of a phase angle. $P_{w,n}$ is the $P_w$ of the neighboring pixel. If $|\Delta P|$ is less than a threshold M (e.g. M=0.6), $\Delta P$ is added to an initially empty red-black tree T. Next, a phase difference of minimum absolute value, $\Delta P_{min}$, is searched out from T and the associated neighboring pixel is identified. The phase for the neighboring pixel, $P_n$, is unwrapped by $$P_n = P_s + \Delta P_{min} \quad (37)$$

The neighboring pixel is labeled to be "visited" to prevent from being visited again in the future rounds of growth, and $\Delta P_{min}$ is also removed from T. The newly grown pixel, in turn, becomes a seed for the next round of growth. This growing process continues until T becomes empty. After the growing process stops, all the grown pixels constitute a region. Throughout the region, P, the unwrapped phase of $O_2$, is obtained for all the pixels. The unified orientation vector field O for the region has two possible values $$O = \pm \exp(iP/2) \qquad (38)$$

wherein the use of "+" or "−" sign will be consistent for all the pixels in the region. In order to make a binary choice, this unified orientation vector field O having two possible values is compared with the original O field pixel by pixel to see if O has been reversed. A consistency score S is defined the same as in equation (33). In this case, two consistency scores S1 and S2 are counted. S1 is counted with respect to possible values of O having a "+" sign for all the pixels, and S2 is counted with respect to possible values of O having a "−" sign for all the pixels. The correct O field can be determined as the one associated with whichever the greater of S1 or S2. In practice, it should be noted that S1≡−S2 and, thus, only one of S1 or S2 needs to be counted, and the other may simply be assumed to be its negative. Accordingly, only one S can be counted and, if S becomes negative, orientation vectors for all the pixels must be reversed. As before, the growing process is repeated many times to cover the entire FOV. The second embodiment of an SRF described above produces the same result as the first embodiment of an SRF provided that two threshold values L and M are equivalent, which requires $$L = \cos(M/2) \qquad (39)$$

Since some phase unwrapping techniques have been used in the second embodiment of an SRF, it is worthwhile to compare the SRF with a general phase unwrapping method. The SRF differs from a general phase unwrapping method in at least three areas. Firstly, an SRF is based on regional phase unwrapping which, in many cases, is much easier than a general phase unwrapping applied in the entire FOV. For instance, it is very difficult, if not impossible, for a general phase unwrapping to handle a case where there are isolated tissues in the FOV. Secondly, an SRF is not a pure phase unwrapping method since it uses other information to do a binary choice of the orientation vector field in each region. Thirdly, the requirement for an SRF is less than that for a general phase unwrapping method; an SRF is only required to make a binary choice for each pixel.

F) Obtaining first pass solutions.

Referring to process box 34 of FIG. 2, after the X and Y images are obtained, and preferably treated by various filters described above, they can be directly used to produce first pass solutions of W and F, by simply taking the magnitudes of X and Y, respectively. The solutions W and F may be directly used to produce water and fat images as shown by dashed line 35 in FIG. 2.

G) Obtaining phase-corrected image equations.

Alternatively, as shown in process box 36 of FIG. 2, the first pass solutions of W and F may be substituted into equations (10–12) to obtain the unknown phasors $P_0$, $P_0 P_1$, and $P_0 P_1^2$ and, thereafter, to obtain phase-corrected three image equations.

With the first pass solutions of W and F given as the magnitudes of X and Y vectors, the phasors $P_0$, $P_0 P_1$, and $P_0 P^2$ can be found from equations (10–12) as $$P_0 = \frac{I_1}{W + CF} \qquad (40)$$

$$P_0 P_1 = \frac{I_2}{W + CAF} \qquad (41)$$

$$P_0 P_1^2 = \frac{I_3}{W + CA^2 F} \qquad (42)$$

In fact, the phasor $P_0 P_1$ is parallel to the orientation vector field O(x,y) after an application of a GOF or an SRF, and an LOF. Thus, $P_0 P_1$ can be obtained directly from the filtered orientation vector field.

The physics requires the above three phasors to be fairly smooth functions. They may include small fluctuations, however, since they are mathematically obtained from a set of complex equations and a cascade of non-linear operations, where the noise and artifacts can propagate in a complicated manner. To suppress these fluctuations and still keep the slowly changing phase information, they can be smoothed with a standard n×n pixel sliding window averaging (between 5×5 and 21×21, for example 11×11) in the real and imaginary parts, respectively. The smoothing process should effectively reduce the standard deviation of the small fluctuation by a factor of n. This window should be large enough to give enough noise reduction in the phasor, but small enough to be consistent with the smooth spatial phasor change. The smoothed phasors $P_0$, $P_0 P_1$, and $P_0 P_1^2$ are then removed from the original equations (10–12), resulting in the following phase-corrected image equations $$I_1^0 = W + CF \qquad (43)$$

$$I_2^0 = W + CAF \qquad (44)$$

$$I_3^0 = W + CA^2 F \qquad (45)$$

where $I_1^0$, $I_2^0$, and $I_3^0$ are obtained by multiplying $I_1$, $I_2$, and $I_3$ with the complex conjugate of the corresponding smoothed phasors, respectively.

H) Obtaining second pass solutions.

Referring to process box 38 in FIG. 2, three sets of solutions for W and F can be found respectively from equation pairs of (43, 44), (44, 45), and (43, 45), respectively, as $$\begin{cases} W_{12} = \dfrac{I_1^0 A - I_2^0}{A - 1} \\ F_{12} = \dfrac{I_2^0 - I_1^0}{C(A - 1)} \end{cases} \qquad (46)$$

$$\begin{cases} W_{23} = \dfrac{I_2^0 A - I_3^0}{A - 1} \\ F_{23} = \dfrac{I_3^0 - I_2^0}{CA(A - 1)} \end{cases} \qquad (47)$$

$$\begin{cases} W_{13} = \dfrac{I_1^0 A^2 - I_3^0}{A^2 - 1} \\ F_{13} = \dfrac{I_3^0 - I_1^0}{C(A^2 - 1)} \end{cases} \qquad (48)$$

I) Averaging the solutions.

The three sets of solutions of W and F described above should be essentially identical and differ only in noise and artifacts. Accordingly, they can be averaged for an improved final result, as shown in process box 40 in FIG. 2. Since the three solution sets in general have different SNR, an optimally weighted averaging would be more superior than a simple averaging as follows:

$$<W> = \lambda W_{12} + \eta W_{23} + \xi W_{13} \qquad (49)$$

$$\langle F \rangle = \lambda F_{12} + \eta F_{23} + \xi F_{13} \quad (50)$$

where $\lambda$, $\eta$, and $\xi$ are the optimal weighting factors satisfying the following normalization condition $$\lambda + \eta + \xi = 1 \quad (51)$$

In terms of SNR, the optimal choice of these weighting factors $\lambda$, $\eta$, and $\xi$ are derived as follows:

From equations (46–49), the water image after weighted averaging can be written as $$\langle W \rangle = \quad (52)$$
$$I_1^0 \frac{A}{A-1}\left(\lambda + \frac{A}{A+1}\xi\right) + I_2^0 \frac{1}{A-1}(A\eta - \lambda) - I_3^0 \frac{1}{A-1}\left(\eta + \frac{\xi}{A+1}\right)$$

According to the rule of noise propagation, the noise standard variance in $\langle W \rangle$ is $$\sigma_w^2 = \sum_{j=1}^{3}\left|\frac{\partial \langle W \rangle}{\partial I_j}\right|^2 \sigma_0^2 \quad (53)$$

It is assumed that $I_0^0$, $I_2^0$, and $I_3^0$ have the same noise level as their original counterparts $I_1$, $I_2$, and $I_3$, respectively, i.e. $\sigma_1^2 = \sigma_2^2 = \sigma_3^2 = \sigma_0^2$, because the noise levels in the phasors $P_0$, $P_0 P_1$, and $P_0 P_1^2$ are greatly reduced by the heavy smoothing operation to be essentially negligible. Using the fact that $|A|=1$, the output-input noise standard variance ratio can be found as $$\frac{\sigma_{w2}}{\sigma_0^2} = \frac{1}{|A-1|^2}\left(\left|\lambda + \frac{A}{A+1}\xi\right|^2 + |\lambda - A\eta|^2 - \left|\eta + \frac{\xi}{A+1}\right|^2\right) \quad (54)$$

Using equation (14), the above expression can be written as $$\frac{\sigma_{w2}}{\sigma_0^2} = \frac{1}{1-\cos\alpha}\left[\lambda^2 + \eta^2 - \lambda\eta\cos\alpha + (\lambda + \eta)\frac{\xi}{2} + \frac{\xi^2}{1+\cos\alpha}\right] \quad (55)$$

where a is the angular increment in the three acquisitions.

Eliminating $\xi = 1 - \lambda - \eta$, we have $$\frac{\sigma_{w2}}{\sigma_0^2} = \frac{2(1+\cos\alpha)}{1-\cos\alpha}[(\lambda^2 + \eta^2 - 2\lambda\eta\cos\alpha)(2+\cos\alpha) + \quad (56)$$
$$(\lambda + \eta)(\cos\alpha - 1) + 1]$$

To minimize the above expression with appropriate $\lambda$ and $\eta$, we need $$\begin{cases} \frac{\partial}{\partial \lambda}\left(\frac{\sigma_{w2}}{\sigma_0^2}\right) = 0 \\ \frac{\partial}{\partial \eta}\left(\frac{\sigma_{w2}}{\sigma_0^2}\right) = 0 \end{cases} \quad (57)$$

From the above equations, it is straightforward to obtain the following $$\begin{cases} \lambda = \eta = \frac{1}{2(2+\cos\alpha)} \\ \xi = \frac{1+\cos\alpha}{2+\cos\alpha} \end{cases} \quad (58)$$

An SNR equivalent, "number of signal averaged" (NSA*), of the optimal averaging is derived as follows: Substituting (58) into (55), the optimized output-input noise standard variance ratio is $$\left(\frac{\sigma_{w2}}{\sigma_0^2}\right)_{opt} = \frac{3}{4(2+\cos\alpha)(1-\cos\alpha)} \quad (59)$$

Therefore, the optimized equivalent "number of signal averaged" (NSA*) is, $$(NSA^*)_{opt} = 1 \Big/ \left(\frac{\sigma_{w2}}{\sigma_0^2}\right)_{opt} = \frac{4}{3}(2+\cos\alpha)(1-\cos\alpha) \quad (60)$$

Similarly, the NSA* for a simple averaging can be obtained as follows: Substituting $\lambda = \eta = \xi = 1/3$ into (55), we obtain the corresponding result for simple averaging $$\left(\frac{\sigma_{w2}}{\sigma_0^2}\right)_{simple} = \frac{5 + 4\cos\alpha + 2\sin^2\alpha}{18\sin^2\alpha} \quad (61)$$

and $$(NSA^*)simple = 1 \Big/ \left(\frac{\sigma_{w2}}{\sigma_0^2}\right)_{simple} = \frac{18\sin^2\alpha}{5 + 4\cos\alpha + 2\sin^2\alpha} \quad (62)$$

An exactly analogous derivation yields an identical result for the fat image.

Figure 8:
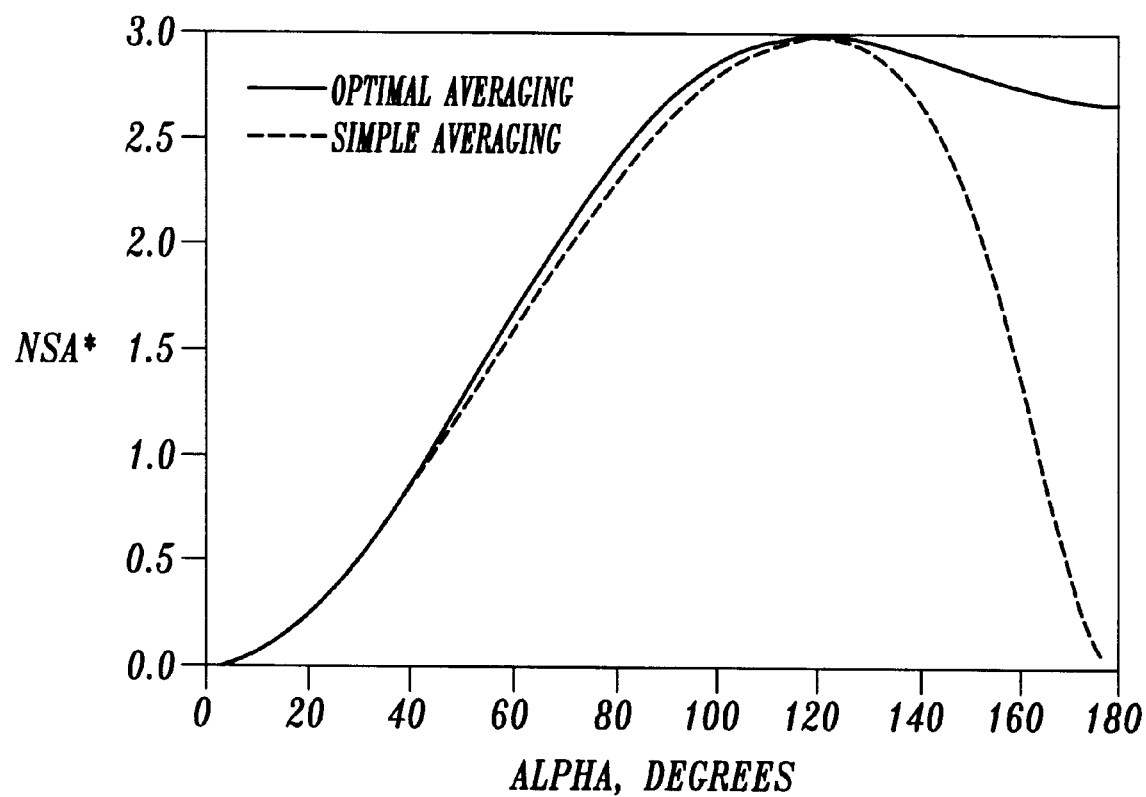
FIG. 8 is a graph showing SNR equivalent values for an optimal averaging method and a simple averaging method, respectively, employed in embodiments of the present invention.

Equations (60, 62) are plotted together in FIG. 8. The NSA* of the optimal averaging is higher everywhere than the simple averaging, except at points of 0° and 120°, where both averaging are 0 and 3, respectively. FIG. 8 also shows that the two averaging differ significantly for $\alpha$ angles larger than 120°. This is due to the fact that as $\alpha$ approaches 180°, solutions $W_{13}$ and $F_{13}$ become more noisy and, thus, their weighting factor $\xi$ should diminish for an optimal SNR, as seen in equation (58). It can be shown that the optimal averaging is actually identical to a W and F solution obtained from equations (43–45) with a complex valued or real valued least square error (LSE) method, as known in the art.

The noise performance of DPE has been found to be excellent, especially at small a angles, which is desirable for water-fat imaging at low $B_0$ field, or for pulse sequences with more timing restrictions.

J) Outputting two separate images.

Referring to process box 42 in FIG. 2, the final output of water and fat images can be taken as the real parts of the optimally averaged $\langle W \rangle$ and $\langle F \rangle$, to produce two images of water and fat, respectively. By definition, any leakage in the imaginary channels is due to noise and artifacts. This allows another improvement of image quality, as compared to the direct solution from the magnitudes of X and Y vectors, because the noise and artifacts in the imaginary channel are discarded.

It should be noted that the solution stability of DPE depends on the angular increment $\alpha$, which determines the parameter A in equation (23). For example, when a is so small that A=1, the (X, Y) solutions in equations (21, 22) become unstable since the denominator of equation (23) is nearly zero. On the other hand, $\alpha=180°$ (corresponding to A=−1) would be a good choice for a more stable (X Y) solutions.

Equations (17, 18) indicate that the angle between the solution vectors X and Y, or the water and fat magnetization vectors, is equal to the combined angle $\alpha_0+\alpha$. The value of this angle is crucial in determining the leading and lagging vectors, as well as performing the orientation filtering. For these operations, the phase error tolerance in X and Y is maximized when $\alpha_0+\alpha$ is 90° or −90°, at which the leading and lagging phase relation is best defined. Therefore, for choosing the correct solution of (X,Y), a sampling scheme with water and fat being orthogonal in the second image would be optimal, i.e. the central point should be a quadrature sampling.

In situations where one of the images is acquired with water and fat in-phase, as in the Dixon method described by equation (6), it is easy to extract the phase error $\Phi$ from this image. An initial phase correction can be performed by multiplying all three complex images with the complex conjugate phase error $\Phi$. This phase correction is especially useful for gradient-echo sequences where the phase error $\Phi$ contains a major contribution of $B_0$ field inhomogeneity, as discussed earlier. The phase error $\Phi$, when very large and uncorrected, may have negative impact on the orientation filters and the smoothing operations, as they both assume slowly changing phase errors.

In DPE, the real and imaginary parts of the original images are not just defined relatively. Instead, they have absolute significance. For instance, if the real and imaginary parts of the original complex images are swapped before they are sent into the subroutine for W and F determination, not only the W and F output will be swapped, but also some artifacts of inconsistent water and fat assignment may occur because the algorithm assumes and uses an asymmetry between water and fat. Thus, the definition of real and imaginary parts on a particular scanner should be verified before applying DPE with the scanner.

DPE is quite tolerant to noise and artifacts and, thus, robust. The data acquisition and utilization of DPE are very efficient. The three interleaved acquisitions not only provide a reliable water-fat determination, but also improve the SNR significantly. Further, DPE requires no pre-scan shimming. For some applications such as T2-weighted imaging, the scan time of the spin-echo version of DPE can be quite long due to the long TR used. Accordingly, DPE may be used with the RARE or Fast Spin-Echo techniques as known in the art for a shorter scan time. As noted above, the combination of DPE with many other known image acquisition sequences should be fairly straightforward to those skilled in the art.

If some basic properties of MR images are used, it might be possible to achieve effective water-fat imaging with fewer than three data acquisitions. This can be done in a similar way as the motion artifact reduction technique, where a "gradient energy" relation allows the required number of data acquisitions to be reduced from three to two, except here the two quantities to be separated are not the image and the ghosts, but the water and fat components. Furthermore, techniques such as partial Fourier or low resolution phase mapping can be combined with DPE for a higher time efficiency.

Among the infinite number of possible sampling schemes in the family of ($\alpha_0$, $\alpha_0+\alpha$, $\alpha_0+2\alpha$), several are of particular interests. The triple quadrature schemes of (−270°, −90°, 90°) or (−90°, 90°, 270°) are optimal for both solution stability and phase error tolerance. In addition, because all three acquired images are quadrature, a comparison in their magnitudes would allow an easy extraction of the $T_2^*$ and $T_2$ maps ($T_2^*$ and $T_2$ are relaxation times as known in the art). The disadvantages include inconvenience in the initial phase correction of $\Phi$, and relatively long span of time shift $\Delta t$. However, at these triple quadrature sampling angles, special data processing treatments exist to optimize the equivalent NSA* to be nearly 3. Details of these treatments, collectively termed three orthogonal phase (TOP) acquisition method, will be discussed below. Alternatively, sampling schemes of (0°, 120°, 240°) or (0°, −120°, −240°) are more compact in time, allow an easy initial phase correction of $\Phi$, an optimized SNR according to FIG. 8, and an easy extraction of the $T_2^*$ map. However, the solution stability is not as good as that with $\alpha=180°$, and the phase error tolerance is sub-optimal since water and fat vectors are not orthogonal but at a 120° angle in the second image.

EXAMPLE

Considering factors such as solution stability, phase error tolerance, SNR, span of $\Delta t$, and initial phase correction, a (0°, 90°, 180°) version of DPE has been implemented on several clinical imagers with field strengths ranging from 0.5 T to 1.5 T (SIGNA, GE Medical Systems, Milwaukee, Wisc.; and EDGE, Picker International, Inc., Highland Heights, Ohio). The standard spin-echo sequences were modified to perform a 3-point interleaved acquisition by shifting either the 180° RF pulse or the frequency encoding structure. With this sampling scheme, the more familiar "in-phase" and "opposed-phase" images are also easily available, which by themselves may be usefild in certain applications. Almost all parts of the body of volunteers and patients have been imaged, including head, neck, shoulder, chest, arm, wrist, abdomen, pelvis, hip, thigh, knee, calf ankle, and foot, at different orientations using a variety of RF coils.

Raw data or complex image data were saved and processed on UNIX based workstations (Sun Sparc10, Sun Microsystems, Mountain View, Calif.; and DEC 3000/400, Digital Equipment Corporation, Maynard, Mass.). The algorithm was coded in the C-programming language as a subroutine which inputs the three complex images and outputs the water and fat images with no user intervention. The operations are summarized in a straightforward flowchart in FIG. 2.

The data processing software is fully automatic and has been made so user friendly that the water and fat images could be reconstructed in minutes after each scan. With a current version of the software, the processing time per slice from the three complex images to the water and fat images on a Sparc 10 workstation is only 15–20 seconds for a 256×256 matrix size, depending on the anatomical structure in the image.

Experiments were also performed to test other sampling schemes such as (45°, 90°, 135°) and (0°, 120°, 240°) with both spin-echo and gradient-echo sequences on a 0.5 T GE SIGNA system, as well as on a 1.5 T Picker EDGE system. In all the experiments, no special effort was spent to shim the magnetic field.

Studies on volunteers and patients, each of 5–24 slices, have been performed in several local hospitals, mostly with Ti weighted but a few $T_2$ weighted scans. The results were consistently excellent.

II. Three Orthogonal Phase (TOP) Acquisition Method.

As discussed previously, a sampling scheme with A=−1 is a good choice for the (X,Y) solution stability, while a sampling scheme with CA=±i is the best choice for phase error tolerance. A sampling scheme of (−90°,90°,270°) or (90°,−90°,−270°) acquires three orthogonal-phase (TOP) images. TOP sampling scheme satisfies both A=−1 and CA=±i, thus has stable (X,Y) solutions and strong phase error tolerance. Furthermore, water-fat chemical shift effect will not cause any magnitude differences among the three orthogonal-phase images, which allows magnitude error correction, leading to an improved performance. The following describes the TOP method of the present invention, as a special case of the general DPE method, taking the (−90°,90°,270°) image acquisition scheme as an example. The other acquisition scheme (90°,−90°,−270°) is very much identical with the former acquisition scheme and, thus, will not be described in detail.

A) Acquiring three images.

Three complex images are acquired with their phase shifts between water and fat components as (−90°,90°,270°), in a manner described above. This image acquisition scheme corresponds to $\alpha_0=-90°$ and $\alpha=180°$ in the general DPE sampling scheme ($\alpha_0$, $\alpha_0+\alpha$, $\alpha_0+2\alpha$). The three acquired complex images can be expressed as $$I_1 = (W-iF)P_0 \quad I_2 = (W+iF)P_0 P_1 \quad I_3 = (W-iF)P_0 P_1^2 \tag{63}$$

where W, F, $P_0$ and $P_1$ are defined as above. The magnitudes of $I_1$, $I_2$, and $I_3$ can be normalized to their averaged value, which would reduce the effects of erroneous magnitude modulations. One major cause of erroneous magnitude modulations is intra-voxel dephasing which includes the effect of $T_2^*$. The magnitude error corrected $I_1$, $I_2$, and $I_3$ are used in equation (63) for further data processing.

B) Obtaining two solution sets for pixels with two components.

Equation (63) can be solved similarly as in DPE method. By defining X and Y as $$X = WP_0 P_1 \quad Y = iFP_0 P_1 \tag{64}$$

the following equations are derived $$I_2 = X+Y \quad I_1 I_3 = (X-Y)^2 \tag{65}$$

Two possible sets of (X,Y) solutions are given by $$X = \frac{1}{2}(I_2 \pm \sqrt{I_1 I_3}) \tag{66}$$

$$Y = \frac{1}{2}(I_2 \mp \sqrt{I_1 I_3})$$

C) Selecting one correct solution set.

From equations (64), we see that Y should be leading X by 90°. Therefore, X and Y can be distinguished by checking their phase relationship, in the same manner as described above in reference to FIG. 3. This works well when both components are clearly present in a pixel.

D) Treating pixels with a single component.

For some pixels with one of the two components being comparable with the noise level, the single peak treatment is used as in the DPE method.

E) Applying orientation filter(s).

Because this sampling scheme satisfies the condition of CA=i, an SRF with RMST, as described above, may be employed to correct the small amount of wrong (X, Y) assignments. Optionally, A GOF may be applied after an SRF.

In some applications, asymmetric k-space data is acquired and the associated complex images will have a linear phase ramp if no phase correction has been done. Hence there may be a linear phase ramp in the constant phasor map $P_0$ which may make the spin reversal filtering more difficult. However, it is not difficult to remove the linear phase ramp from the original images $I_1$, $I_2$, and $I_3$ by either re-centering the data in k-space or automatically detecting and correcting the phase ramp in the image domain as follows. Averaged phase gradients of $I_1$, $<G_x>$ and $<G_y>$, are calculated by $$\langle G_x \rangle = \frac{1}{N} \sum_{x,y} arg[I_1(x+1, y) I_1(x, y)^*] \tag{67}$$

$$\langle G_y \rangle = \frac{1}{N} \sum_{x,y} arg[I_1(x, y+1) I_1(x, y)^*]$$

where N is the total number of pixels in the image and "*" represents complex conjugate. The two averages $<G_x>$ and $<G_y>$ very much represent the linear phase ramp due to data off-centering even though other factors also contribute to them. The linear phase ramp can be removed from the original images $I_1$, $I_2$, and $I_3$ by multiplying to them a phasor map $P_c$, which is given by $$P_c = exp(-i<G_x>x - i<G_y>y) \tag{68}$$

F) Obtaining first pass solutions.

After an SRF, W and F can be obtained by simply taking the magnitudes of X and Y. For the improvement of SNR, as described above.

G) Obtaining phase-corrected image equations.

W and F can be substituted into equations (63) to obtain the unknown phasors $P_0$, $P_0 P_1$, and $P_0 P_1^2$ $$P_0 = \frac{I_1}{W - iF} \tag{69}$$

$$P_0 P_1 = \frac{I_2}{W + iF}$$

$$P_0 P_1^2 = \frac{I_3}{W - iF}$$

Because the above phasors are usually smooth spatial functions, they can be smoothed with a small sliding window to reduce noise. The three smoothed phasors maps $P_0$, $P_0 P_1$, and $P_0 P_1^2$ are removed from equations (63), resulting in the following phase corrected images $$J_1 = W - iF \quad J_2 = W + iF \quad J_3 = W - iF \tag{70}$$

where $J_1$, $J_2$, and $J_3$ are obtained by multiplying $I_1$, $I_2$, and $I_3$ with the complex conjugate of the appropriate phasors, respectively.

H) Obtaining second pass solutions.

Three sets of solutions for W and F can be found as $$W_1 = real(J_1) \quad F_1 = -imag(J_1) \tag{71}$$

$$W_2 = real(J_2) \quad F_2 = imag(J_2) \tag{72}$$

$$W_3 = real(J_3) \quad F_3 = -imag(J_3) \tag{73}$$

I) Averaging the solutions.

These three sets of solutions should be essentially identical and differ only in noise and artifacts, therefore they can be averaged for an improved final result. Thus we have $$<W> = (W_1 + W_2 + W_3)/3 \quad <F> = (F_1 + F_2 + F_3)/3 \tag{74}$$

of which the NSA* achievable is 3.0.

J) Outputting two separate images.

The final output of water and fat images can be produced.

For TOP, it has been found that the NSA* achievable is 3.0 with $\alpha=180°$, as compared to an optimal angle $\alpha=120°$ for the general DPE, as described above. The difference in optimal a angles comes from the different approaches of finding the second pass (W,F) solution. In the general DPE, three complex equations are solved to give an optimal averaged (X,Y) solution. Then the knowledge of W and F being a positive real number is used to take the real parts of X and Y as W and F, respectively. Another approach of finding the second pass solution is to use the knowledge of W and F being a positive real number to split the three complex equations into six real number equations. Then the optimal (W,F) solution is resolved from the six real number equations by a real valued least square error (LSE) method. TOP actually used the second approach to find the second pass (W,F) solution, and is an optimal choice of this approach, i.e. $\alpha=180°$.

Overall, TOP provides high magnitude error tolerance, good solution stability, strong phase error tolerance, and optimal SNR. It seems to be an optimal sampling scheme for a general DPE method.

While the preferred embodiments of the invention have been illustrated and described, it will be appreciated that various changes can be made therein without departing from the spirit and scope of the invention as defined by the appended claims.

The embodiments of the invention in which an exclusive property or privilege is claimed are defined as follows:

1. A method of resolving images of a first chemical species X and a second chemical species Y in an imaged multi-voxel body, comprising:

acquiring three complex magnetic resonance images of the body, wherein the first and second chemical species have relative phase shifts of $\alpha_0$, $\alpha_0+\alpha$, and $\alpha_0+2\alpha$, respectively, and $\exp(i\Delta\omega\tau_0)\exp(i\Delta\omega\tau)\neq\pm1$, where $\Delta\omega$ is a difference in Larmor frequencies between the two species X and Y, $\tau_0=\alpha_0/\Delta\omega$, and $\tau=\alpha/\Delta\omega$;

combining the three complex images to obtain two solution sets for X and Y;

selecting one solution set for X and Y based on a known relative difference in Larmor frequencies of X and Y; and outputting two separate images of the chemical species X and Y.

2. The method of claim 1, further comprising treating voxels including generally only one chemical species with a known statistical bias.

3. The method of claim 1, further comprising applying a global orientation filter to each of the images of the chemical species X and Y, comprising:

(a) selecting a seed pixel and calculating its orientation vector based on a supposed assignment of X and Y of the seed pixel;

(b) comparing the orientation vector of the seed pixel with two possible orientation vectors of its neighboring pixel, respectively;

(c) determining the correct orientation vector for the neighboring pixel based on an assumption that a orientation vector varies generally smoothly from a voxel to a neighboring voxel;

(d) identifying the correct X and Y assignment for the neighboring pixel based on the determination made in step (c);

(e) repeating steps (b) through (d) for each of the neighboring pixels that have not been identified; and (f) repeating steps (a) through (e) with the neighboring pixel becoming the seed pixel until the entire image is identified.

4. The method of claim 3, wherein steps (a) through (f) are repeated for a plurality of times until all pixels within the image are identified for a predetermined number of times.

5. The method of claim 3, wherein a phase coherence test is employed to prevent invalid operation of the global orientation filter, the phase coherence test comprising ensuring the difference between the orientation vector of the seed pixel and at least one of the two possible orientation vectors of the neighboring pixel be within a predetermined threshold angle range.

6. The method of claim 3, wherein a score of consistency S is counted, S being increased if the determination made in step (c) confirms that the orientation vector for the neighboring pixel was initially identified correctly, S being decreased if otherwise, the step (e) being terminated if S becomes negative.

7. The method of claim 1, further comprising using the solution set for the chemical species X and Y to obtain phase error values $P_0$, $P_0P_1$, and $P_0P_1^2$, the phase error values being used to obtain phase error corrected three images.

8. The method of claim 7, further comprising using the phase error corrected images to obtain three sets of second pass solution sets of the chemical species X and Y.

9. The method of claim 8, further comprising averaging the three sets of second pass solution sets of the chemical species X and Y to obtain an optimal solution set of the chemical species X and Y.

10. The method of claim 8, further comprising using the three sets of second pass solution sets and using a complex valued or real valued least square error method to obtain an optimal solution set of the chemical species X and Y.

11. The method of claim 1, further comprising applying a local orientation filter to each of the images of the chemical species X and Y, comprising:

(a) casting a sliding window;

(b) obtaining a mean orientation vector value for the sliding window;

(c) calculating two possible orientation vectors for a central pixel within the sliding window;

(d) comparing the mean orientation vector value with two possible orientation vectors of the central pixel, respectively;

(e) determining the correct orientation vector for the central pixel based on an assumption that an orientation vector varies generally smoothly from a voxel to a neighboring voxel;

(f) identifying the correct X and Y assignment for the central pixel based on the determination made in step (e);

(g) repeating steps (a) through (f) by each time sliding the sliding window to a new position until the entire image is identified.

12. The method of claim 1, wherein $\alpha_0+\alpha$ is 90° or −90°.

13. The method of claim 12, further comprising applying a spin reversal filter to each of the images of the chemical species X and Y, comprising:

(a) selecting a seed pixel and calculating its orientation vector based on a supposed assignment of X and Y of the seed pixel;

(b) comparing the orientation vector of the seed pixel with two possible orientation vectors of its neighboring pixel, respectively, by obtaining respective dot products;

(c) adding the dot product to a data structure tree if an absolute value of the dot product is greater than a predetermined threshold value;

(d) repeating steps (b) and (c) for each of the neighboring pixels that have not been compared;

(e) selecting the dot product with a maximum absolute value from the data structure tree;

(f) reversing the initial identification of the X and Y chemical species of the pixel having the dot product with a maximum absolute value if the dot product with a maximum absolute value is negative;

(g) counting a score of consistency S, S being decreased if a reversal occurred in step (f), S being increased if otherwise;

(h) removing the dot product with a maximum absolute value from the data structure tree;

(i) repeating steps (a) through (h) with the neighboring pixel becoming the seed pixel until the data structure tree becomes empty; and (j) swapping the initial identification of the X and Y chemical species of all the pixels within the image if a score of consistency S is negative.

14. The method of claim 13, wherein the data structure tree is a Red-Black Tree.

15. The method of claim 12, further comprising applying a spin reversal filter to each of the images of the chemical species X and Y, comprising:

(a) selecting a seed pixel and calculating its phase value;

(b) calculating an orientation vector and a phase value of a pixel neighboring the seed pixel, and obtaining a phase difference between the phase values of the neighboring pixel and the seed pixel;

(c) adding the phase difference to a data structure tree if an absolute value of the phase difference is less than a predetermined threshold value;

(d) repeating steps (b) and (c) for each of the neighboring pixels that have not been compared;

(e) selecting the phase difference with a minimum absolute value from the data structure tree;

(f) unwrapping the phase value of the pixel having the phase difference with a minimum absolute value;

(g) obtaining first and second possible orientation vectors for each pixel based on the phase value unwrapped in step (f);

(h) removing the phase difference with a minimum absolute value from the data structure tree;

(i) repeating steps (a) through (h) with the neighboring pixel becoming the seed pixel until the data structure tree becomes empty;

(j) counting scores of consistency S1 and S2 for all the pixels, S1 being decreased if the first possible orientation vector of each pixel is reversed with respect to its original orientation vector determined in step (b), S1 being increased if otherwise, S2 being decreased if the second possible orientation vector of each pixel is reversed with respect to its original orientation vector determined in step (b), S2 being increased if otherwise; and (k) determining the orientation vectors associated with whichever the greater of S1 or S2 as the correctly identified orientation vectors.

16. The method of claim 15, wherein the data structure tree is a Red-Black Tree.

17. The method of claim 1, wherein the three complex images are acquired so that magnetization vectors associated with the first and second chemical species X and Y are orthogonal to each other at all three phase shifts of $\alpha_0$, $\alpha_0+\alpha$, and $\alpha_0+2\alpha$.

18. The method of claim 1, wherein $\exp(i\alpha_0)=1$, further comprising removing a phase error $\Phi$ from the three complex images acquired.

19. A computer readable medium having computer executable instructions for performing the method recited in any one of claims 1–18.

20. The method of claim 1, wherein the chemical species X is water and the chemical species Y is fat.

21. A method of resolving images of a first chemical species X and a second chemical species Y in an imaged multivoxel body, comprising:

acquiring three complex magnetic resonance images of the body, wherein the first and second chemical species have relative phase shifts of $\alpha_0$, $\alpha_0+\alpha$, and $\alpha_0+2\alpha$, respectively, and $\exp(i\Delta\omega\tau_0)\exp(i\Delta\omega\tau)\neq\pm 1$, where $\Delta\omega$ is a difference in Larmor frequencies between the two species X and Y, $\tau_0=\alpha_0/\Delta\omega$, and $\tau=\alpha/\Delta\omega$;

combining the three complex images to obtain two solution sets for X and Y;

selecting one solution set for X and Y based on a known relative difference in Larmor frequencies of X and Y; and using the solution set for X and Y and at least one of the three complex images to obtain at least one of phase error values $P_0$, $P_0P_1$, and $P_0P_1^2$;

removing at least one of the phase error values from at least one of the three complex images to obtain at least one set of phase-corrected complex images of X and Y;

using the at least one set of phase-corrected complex images to obtain second-pass solutions for the first and second chemical species X and Y;

outputting the second-pass solutions as two separate images of the chemical species X and Y.

22. The method of claim 21, wherein the solution set for X and Y and the three complex images are used to obtain phase error values $P_0$, $P_0P_1$, and $P_0P_1^2$, the phase error values $P_0$, $P_0P_1$, and $P_0P_1^2$ are removed from the three complex images to obtain three phase-corrected complex images of X and Y, the three phase-corrected complex images are used to obtain three sets of second-pass solutions for the first and second chemical species X and Y, and the three sets of second-pass solution sets are used in a complex valued or real valued least square error method to obtain an optimal second-pass solution set of the chemical species X and Y.

* * * * *